United States Patent [19]

Dorri et al.

[11] Patent Number: 5,410,288

[45] Date of Patent: Apr. 25, 1995

[54] PERSISTENT SUPERCONDUCTING SWITCH FOR A SUPERCONDUCTING MAGNET FOR IMAGING HUMAN LIMBS

[75] Inventors: Bizhan Dorri, Clifton Park; Evangelos T. Laskaris, Schenectady; Kenneth G. Herd, Schenectady, all of N.Y.

[73] Assignee: General Electric Company, Schenectady, N.Y.

[21] Appl. No.: 235,959

[22] Filed: May 2, 1994

Related U.S. Application Data

[63] Continuation-in-part of Ser. No. 301, Jan. 4, 1993, abandoned.

[51] Int. Cl.⁶ .............................................. H01F 7/22
[52] U.S. Cl. .................................................... 335/216
[58] Field of Search ............ 335/216; 174/15.4, 15.5, 174/125.1; 29/599; 361/141, 19; 338/325; 336/DIG. 1; 505/230, 234, 704, 705, 879, 880, 881, 884–887, 924, 925

[56] References Cited

U.S. PATENT DOCUMENTS

| | | |
|---|---|---|
| 3,200,368 | 8/1965 | Stekly et al. . |
| 4,336,523 | 6/1982 | Joggi . |
| 4,500,860 | 2/1985 | Vermilyea . |
| 4,528,532 | 7/1985 | Keim . |
| 4,584,547 | 4/1986 | Thornton . |
| 4,586,017 | 4/1986 | Laskaris et al. . |
| 4,631,808 | 12/1986 | Jones . |
| 4,803,456 | 2/1989 | Benesch . |
| 4,894,906 | 1/1990 | Huang . |
| 4,904,970 | 2/1990 | Srivastava . |
| 4,907,338 | 3/1990 | Thornton . |
| 4,924,198 | 5/1990 | Laskaris . |
| 5,093,645 | 3/1992 | Dorri et al. . |
| 5,231,366 | 7/1993 | Haramaki et al. ................ 335/216 |
| 5,253,413 | 10/1993 | Dorri et al. . |
| 5,290,638 | 3/1994 | Williams et al. . |

Primary Examiner—Leo P. Picard
Assistant Examiner—Ramon M. Barrera
Attorney, Agent, or Firm—Douglas E. Erickson; Paul R. Webb, II

[57] ABSTRACT

A superconductive magnet subassembly has a single unbroken length of superconductive conductor which has a mid portion wound so as to define at least one superconductive magnetic coil and which has two end portions superconductively joined together by a superconductive joint. A superconductive switch is at least partially defined by the two end portions and by a heater for controllably heating the two end portions.

10 Claims, 6 Drawing Sheets fig. 1 fig. 2 fig. 3 fig. 4 fig. 5a fig. 5b fig. 5c fig. 5d fig. 5e fig. 5f fig. 6a fig. 6b fig. 7a fig. 7b fig. 8

PERSISTENT SUPERCONDUCTING SWITCH FOR A SUPERCONDUCTING MAGNET FOR IMAGING HUMAN LIMBS

CROSS-REFERENCE TO RELATED APPLICATION

This application is a continuation-in-part of application Ser. No. 08/000,301, filed Jan. 4, 1993, now abandoned.

BACKGROUND OF THE INVENTION

1. Field of the Invention

This invention relates to persistent switches for use in superconducting magnets. Such structures of this type, generally, provide a superconducting switch for a small, low cost magnet which is to be used for imaging human limbs.

2. Description of the Related Art

Many different kinds of superconducting switches have been built and used in superconducting magnets. The most common switch is made by winding long lengths of the superconductor with its original stabilizer (copper in many cases) and forming a switch which has a relatively high electrical resistance. Other switches with high resistance stabilizers such as supro nickel or stainless steel have been used in superconducting magnets. Known superconductive switches are joined to superconductive coils to help define superconducting magnets.

Exemplary of such switches with high resistance stabilizers is U.S. Pat. No. 5,093,645, entitled "Superconductive Switch for Conduction Cooled Superconductive Magnet" to Dorri et al. and assigned to the same assignee as the present invention. The switches with high resistance have the advantage of requiring shorter length, therefore will be smaller in size (fast recovery time for converting from normal to superconducting state) and, thus, are better suited for magnets with high inductance.

It is apparent from the above that there exists a need in the art for a superconducting switch which is compact through simplicity of parts and uniqueness of structure, and which at least equals the switching characteristics of the known superconducting switches particularly those as discussed in the above-identified Dorri et al. patent, but which at the same time is capable of being used in a small, low inductance magnet. It is a purpose of this invention to fulfill this and other needs in the art in a manner more apparent to the skilled artisan once given the following disclosure.

SUMMARY OF THE INVENTION

Generally speaking, this invention fulfills these needs by providing a superconductive magnet subassembly having a single unbroken length of superconductive conductor. Such conductor is coolable to below its critical temperature and has a mid portion and two end portions. The mid portion is located between the two end portions, and the mid portion is wound so as to define at least one superconductive magnetic coil. The subassembly also has a superconductive joint superconductively joining together the two end portions. The subassembly further has a device for controllably heating the two end portions. The two end portions and the controllably heating device at least partially define a superconductive switch.

The preferred superconducting magnet, according to this invention, offers the following advantages: lightness in weight; easy assembly; excellent switching characteristics; good stability; good durability; excellent economy, and high strength for safety. In fact, in many of the preferred embodiments, these factors of lightness of weigh, ease of assembly, excellent switching characteristics and economy are optimized to an extent that is considerably higher than theretofore achieved in prior, known superconducting switches. In addition, the use of a single unbroken length of superconductive conductor for both the superconductive magnetic coil and the superconductive switch eliminates the need for extra prior art joints, such joints offering the potential for unwanted resistive heating which can lead to unacceptable magnetic field drift, as can be appreciated by those skilled in the art.

BRIEF DESCRIPTION OF THE DRAWINGS

The above and other features of the present invention which will be more apparent as the description proceeds are best understood by considering the following detailed description in conjunction with the accompanying drawings wherein like character represent like parts throughout the several veins and in which.

DETAILED DESCRIPTION OF THE INVENTION

Figure 1:
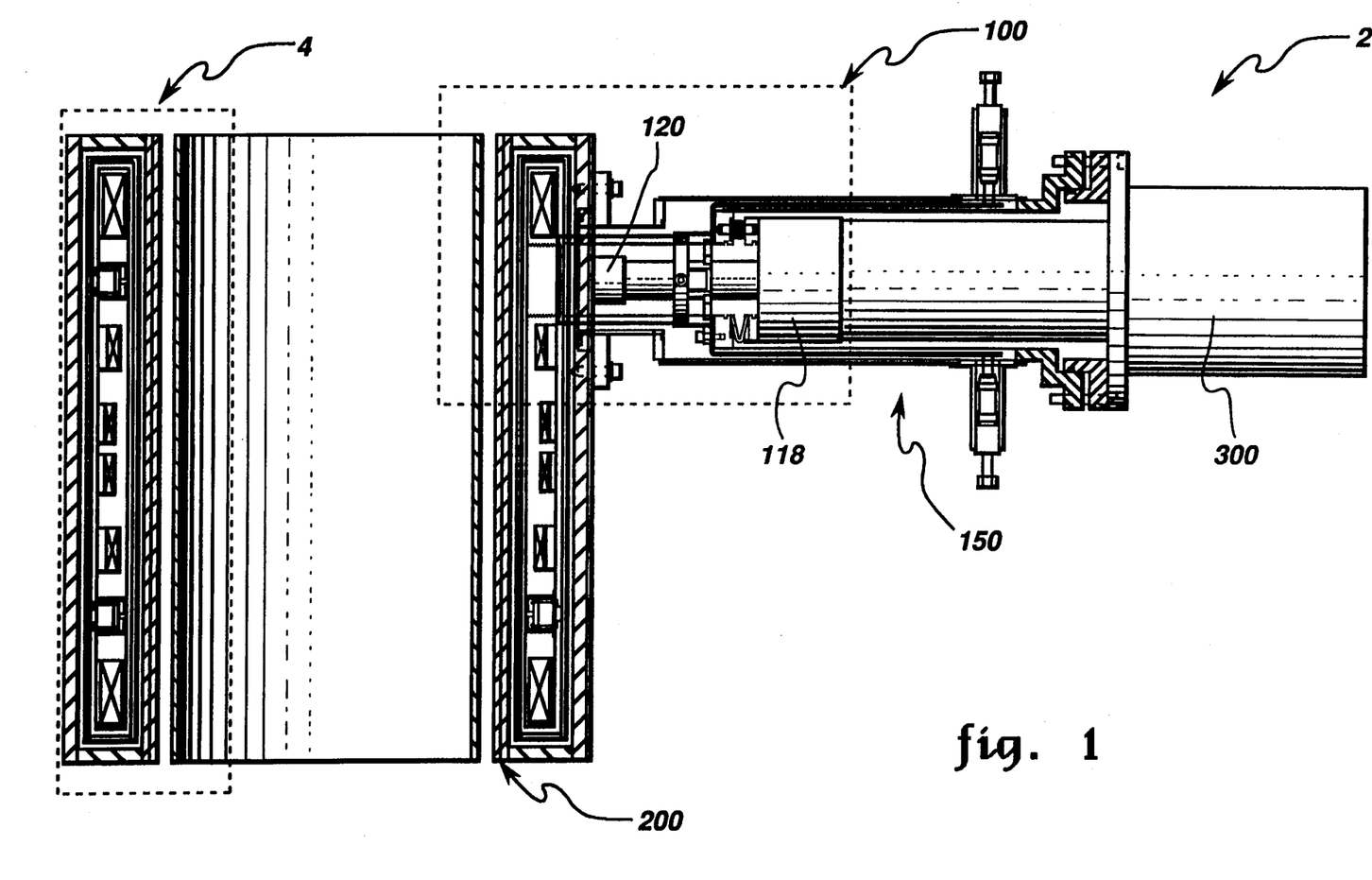
FIG. 1 is a top plan view of an eddy-current free, superconducting imaging magnet for human limbs, according to the present invention.

With reference first to FIG. 1, there is illustrated eddy current-free, superconducting imaging magnet 2 for imaging human limbs. Magnet 2 includes, in part, magnet cartridge assembly 4, High-Tc superconducting lead and mechanical support assembly 100, thermal stations 118, 120, cold head sleeve assembly 150, gradient coil/passive shimming assembly 200 and cryocooler 300.

Figure 2:
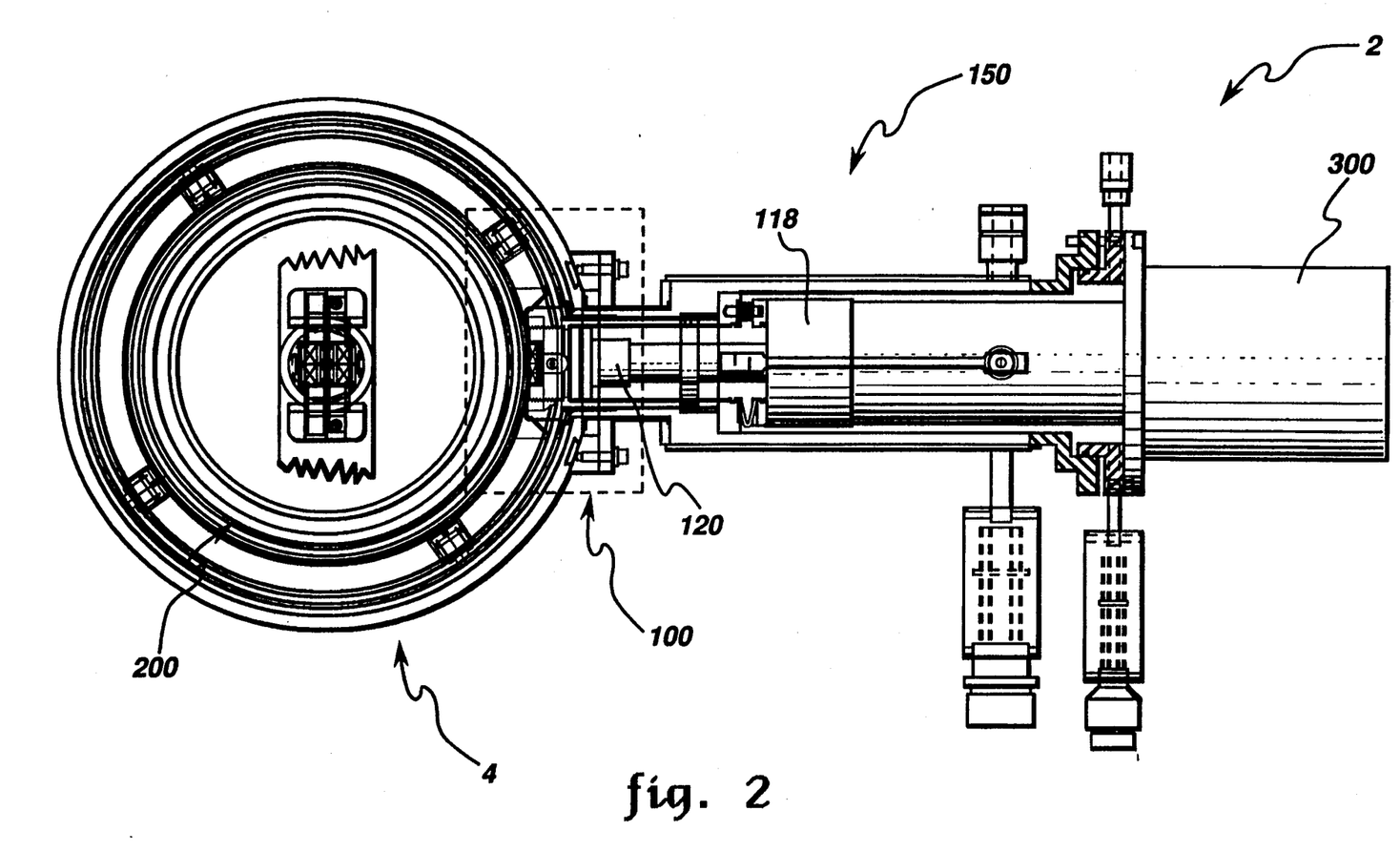
FIG. 2 is a side plan view of the eddy-current free, superconducting imaging magnet for imaging human limbs, according to the present invention.

FIG. 2 is an end view illustration of FIG. 1 in which magnet cartridge assembly 4, High-Tc superconducting lead and magnet support assembly 100, cold head sleeve assembly 150 and gradient coil/passive shim assembly 200 are also illustrated.

Figure 3:
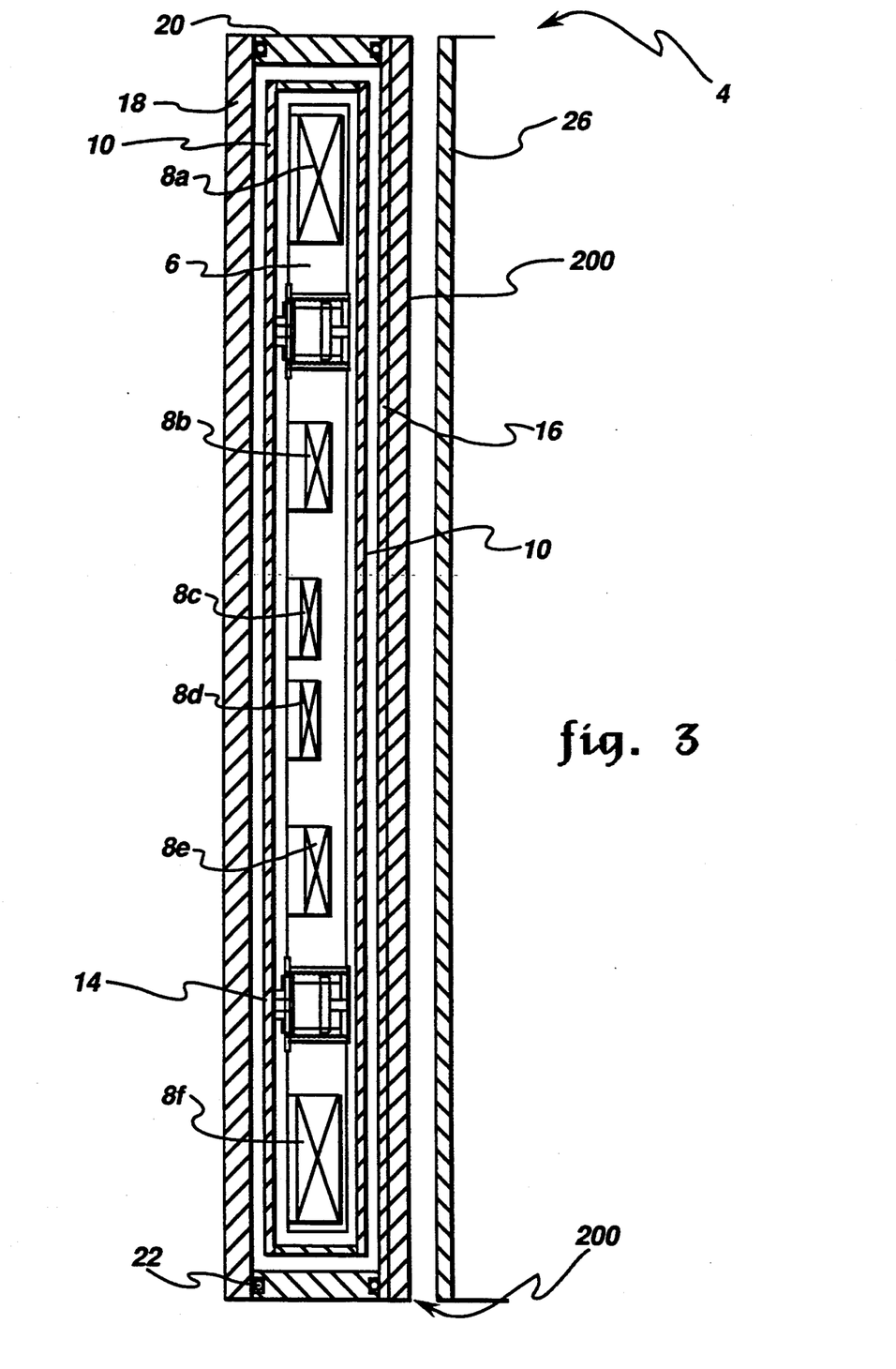
FIG. 3 is an expanded view of the mechanical support and thermal shield assembly for the eddy-current free, superconducting imaging magnet for imaging human limbs.

FIG. 3 is a detailed illustration of magnet cartridge assembly 4 as more generally shown in FIGS. 1 and 2. Magnet cartridge assembly 4 includes, in part, magnet cartridge 6, superconducting coils 8a-8f, thermal shield 10, radial shield supports 14, inner bore tube 16, vacuum enclosure 18, end plate 20, conventional elastomeric O-rings 22, RF coil 26, and gradient coil/shimming assembly 200. In particular, cartridge 6, preferably, is constructed of any suitable epoxy reinforced fiberglass with copper wires (not shown) for axial thermal conduction. Coil 8a-8f are constructed of any suitable superconducting coil material. Thermal shield 10, preferably, is constructed of any suitable epoxy reinforced fiberglass material and copper wire. Bore tube 16, enclosure 18 and plates 20, preferably, are constructed of any suitable epoxy reinforced material with stainless steel. Supports 14 are used such to rigidly attach thermal shield 10 to cartridge 6 such that the heat transference from shield 10 to cartridge 6 can be minimized as magnet 2 is operating.

Figure 4:
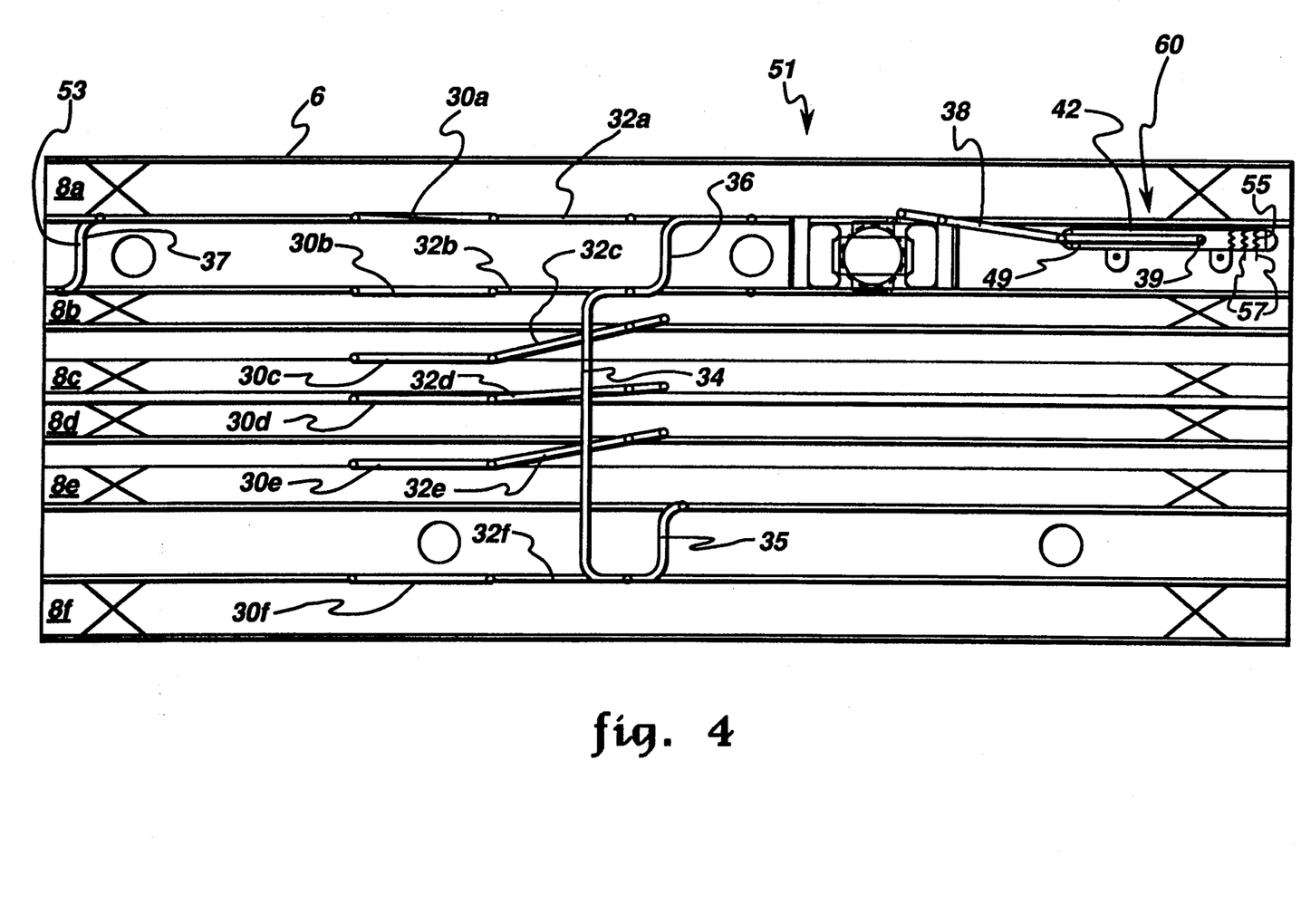
FIG. 4 is a detailed view of the coil form for the eddy-current free, superconducting imaging magnet for imaging human limbs, according to the present invention.

FIG. 4 illustrates in a plan view how conductor windings 8a-8f are wound on cartridge 6. In particular, a single unbroken length of superconductive conductor 42 which has a first end portion 49 (seen in FIGS. 4 & 5) and a second end portion 50 (located underneath the first end portion 49 and seen in FIG. 5) located in switch assembly 60, is traversed along ramp 38 and wound by conventional winding techniques to form winding 8a. Conductor 42 then exits down ramps 30a and 32a to ramp 37. Conductor 42 then exits ramp 37 and enters ramps 30b and 32b to form winding 8b. Winding 8b is then formed by conventional winding techniques. After winding 8b is formed, conductor 42 then traverses along ramps 32c and 30c to form winding 8c. After conductor 42 exits ramps 32c and 30c, winding 8c is formed by conventional winding techniques. After winding 8c is formed, conductor 42 traverses along ramps 32d and 30d where winding 8d is formed by conventional winding techniques. After winding 8d is formed, conductor 42 then traverses along ramps 32e and 30e where winding 8e is formed by conventional winding techniques. After winding 8e is formed, conductor 42 then traverses along ramps 35, 32f and 30f where winding 8f is formed by conventional winding techniques. After winding 8f is formed, conductor 42 then traverses back along ramp 36 and along ramp 38 to switch assembly 60. A superconductive (e.g., pigtail or in-line) joint 39 is formed between the first and second end portions 49 and 50 of the single unbroken length of superconductive conductor 42 in superconducting switch assembly 60.

FIG. 4 additionally illustrates the superconductive magnet subassembly 51 of the invention which includes the single unbroken length of superconductive conductor 42 coolable (via cryocooler 300) to below its critical temperature. Conductor 42 has a mid portion 53 and the two end portions 49 and 50, wherein the mid portion 53 is disposed between the two end portions 49 and 50 and wherein the mid portion 53 is wound so as to define at least one superconductive magnetic coil (e.g., any or all of the windings 8a to 8f). The subassembly 51 also includes the superconductive joint 39 superconductively joining together the two end portions 49 and 50. The subassembly further includes means for controllably heating the two end portions 49 and 50, wherein the two end portions 49 and 50 and the controllably heating means at least partially define a superconductive switch (i.e., superconducting switch assembly 60). Preferably, as shown in FIG. 4, such means includes a heater 55 (such as resistive wiring) and heater leads 57. Other such means include conventional conductive, convective, and radiant heating devices and the like, as is known to those skilled in the art.

Figure 5A:
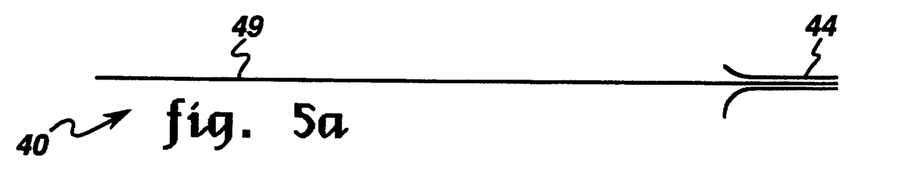
FIGS. 5a–5f illustrate the methods for making a superconducting joint for the eddy-current free, superconducting imaging magnet for imaging human limbs, according to the present invention.

With respect to FIGS. 5a-5f, there is illustrated the various steps for making the superconducting pigtail joint 39 in switch assembly 60. In particular, the operator measures the two end portions 49 and 50 of the single unbroken length of superconductive conductor 42 which make pigtail 39, to one inch longer than the end of switch assembly 60 and cuts end portions 49 and 50. The operator then delaminates each end portion 49, 50 to 6⅜" back with a conventional delaminator and cuts with a conventional scarf. In this process, the operator also conventionally delaminates one inch of the end portions 49 and 50 in addition to 6⅜" in order to allow for the scarfing of the copper strip 44 and then while the chill blocks (not shown) are kept hot, partial relamination is done leaving some part of the copper 44 unlaminated (relaminate to ⅛" diameter pins), as shown in FIG. 5a. It is to be understood that for the sake of simplicity, only end portion 49 is initially illustrated until assembly 40 is almost completely assembled. The process is the same for end portion 50.

Figure 5B:
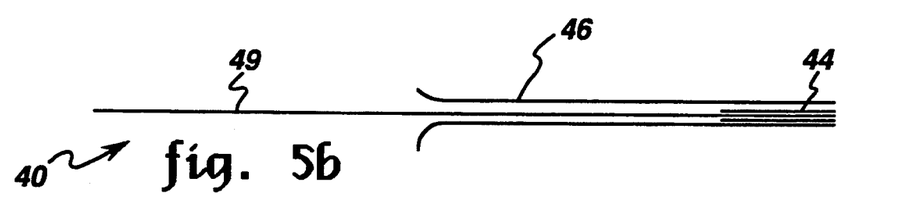

As shown in FIG. 5b, the operator cuts a 9 inch long, one mil thick stainless steel foil 46 with a scarf at one end, (two pieces per conductor). Next the operator measures at least 9 inches plus 3.5 inches (12.5 inches) from the end of end portions 49 and 50 and marks this area to denote the beginning of the stainless steel lamination. The operator then positions the lower stainless steel foil 46 to the copper strip 44 with a conventional solder paste (not shown). Then the operator positions the 12.5 inch mark to the end of the stainless steel foil 46 (non-scarfed end) The operator then hand solders for one inch while maintaining alignment of the stainless steel foil 46 and end portion 49 as shown in FIG. 5b. Next, the operator prepastes the top side of end portion 49 and then positions the top of the stainless steel 46 to the 12.5 inch mark and solders for 1 inch. The operator then positions this subassembly to a conventional relamination block (not shown) with ¾ inch of the pre-soldered assembly outside of the relamination blocks. The operator heats up the relamination blocks to approximately 200° C. and starts the relamination process while maintaining the position of the stainless steel foil 46 (using wet conventional cotton swabs to prevent delamination of the ¾ inch area). This relamination stops before the ends in order to keep the scarfs from soldering to the end portion 49.

Figure 5C:
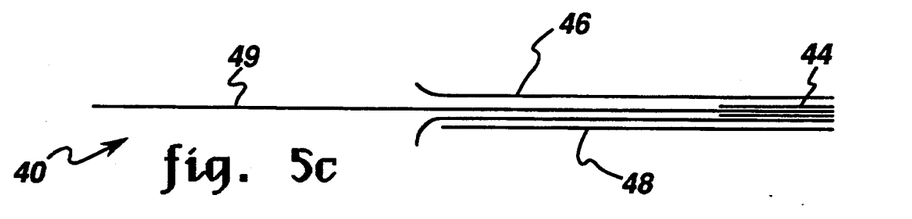

With respect to FIG. 5c, a length of Kapton ® 48 for electrical insulation is cut and attached to the bottom side of end portion 49. The operator starts the Kapton ® 48 at 3¾ inches from the end of end portion 49. This point is on the loose part of the scarf of the stainless steel foil 46. The operator then gently presses down for proper contact. Finally, the operator trims both sides for the entire length as close as possible. Additional pieces of Kapton ® 48 may be necessary for the rest of the length.

Figure 5D:
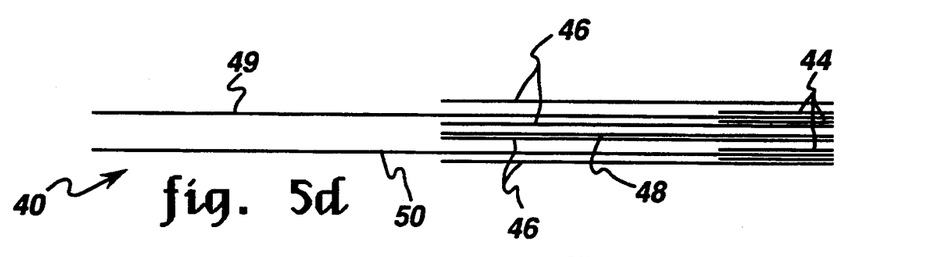

With respect to FIG. 5d, the operator positions both end portions 49 and 50 in the relamination blocks while maintaining complete alignment (the un-scarfed end of the stainless steel 46 can be used for this alignment). The operator then starts with the stainless steel foil 46 in the blocks, heats the relamination blocks to approximately 200° C. and pulls assembly 40 through the relamination blocks, stopping before the stainless steel foil 46 leaves the blocks (to approximately 1 inch of the stainless steel part in the blocks).

Figure 5E:
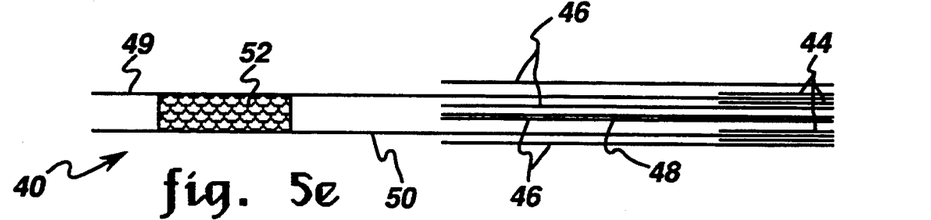

With respect to FIG. 5e, the operator then cools the system 40 down and removes the cover and face plate (not shown) before trying to remove superconductor assembly 40 from the block. The operator then positions the superconductor assembly 40 in the slot guide (not shown) to finish soldering (by hand). If end portions 49 and 50 are misaligned, the operator merely has to solder them outside of the slot guide. The operator then positions the 1 inch (from the end) and the 2¼ inch mark to the tapers of the welding chill block (not shown). This will ensure a location of weld 52 which will be approximately 1¼ inch long and 1 inch from the end of end portions 49 and 50. The operator then makes a conventional superconducting weld 52. It is to be understood that all markings should be done with a soft, blunt marker without pressure.

Figure 5F:
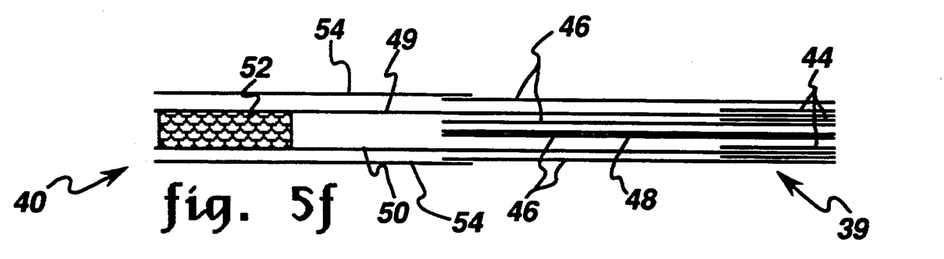

With respect to FIG. 5f, the operator carefully cuts the end of end portions 49 and 50 to about 1/16 inch from weld 52 (not cutting any outer region). This is approximately 1 inch. The operator then cuts two pieces of stainless steel 54, each about 3 inches long, scarfing only one end of each. The operator then prepastes one stainless steel piece 54 which is positioned to the heat block (not shown) on the scarfed end towards the front of the heat block. The operator then positions an end of weld 52 to line up with the un-scarfed stainless steel piece 54. The operator prepastes a second stainless steel piece 54, maintaining scarfs in opposite directions, and another piece 59 is positioned on weld 52 similar to the lower piece. Next the operator positions the heat block cover (not shown) and carefully tightens with a conventional spring loaded screw. This assembly is heated to approximately 200° C. and held for 30 seconds. The heating is then stopped and the assembly is cooled. Finally, the operator disassembles the cover, removes the front plate to remove the weld 52, and removes superconductor assembly 40 which includes pigtail joint 39. It is to be understood if any sticking occurs, the operator merely has to apply alcohol to breakdown the fluxes.

From the above discussion, it is noted that preferably the two end portions 49 and 50 are generally aligned with each other and that the superconductive joint 39 comprises a superconductive weld joint having a weld 52. It is preferred that the superconductive conductor 42 comprises a NbSn superconductive tape. It is further noted that: an electrical insulator 48 is disposed between the two end portions 49 and 50 apart from the superconductive joint 39 (i.e., weld 52); a first metallic foil 46 is disposed between, and in contact with, the electrical insulator 48 and one 49 of the two end portions; a second metallic foil 46 is disposed between, and in contact with, the electrical insulator 48 and the other 50 of the two end portions; and a third metallic foil 54 surrounds the superconductive joint 39 (i.e., weld 52). As previously mentioned, stainless steel foil is preferred for all of the metallic foils 46 and 54.

Figure 6A:
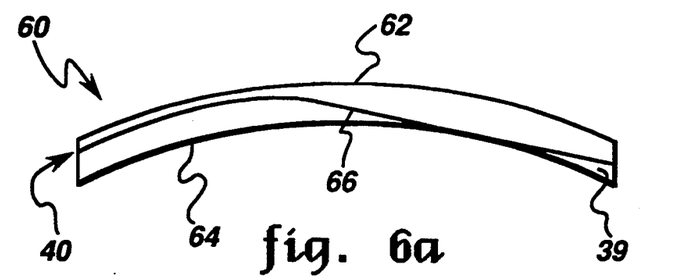
FIGS. 6a and 6b illustrate a side view and an end view, respectively of a housing for a persistent superconducting switch for the eddy-current free, superconducting imaging magnet for imaging human limbs, according to the present invention.

Once pigtail joint 39 is formed in superconducting assembly 40, assembly 40 is placed in persistent superconducting switch assembly 60 as shown in FIG. 6a. Assembly 60 includes, in part, top cover 62, bottom plate 64 and conductor groove 66. Top cover 63 and bottom plate 64, preferably, are constructed of copper. Groove 66, preferably, is machined in assembly 60 by conventional machining techniques.

Figure 6B:
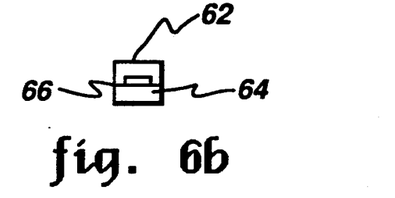

With respect to FIG. 6b, there is illustrated an end view of switch assembly 60 that was previously illustrated in FIG. 6a. As can be seen in FIG. 6b, assembly 60 includes top cover 62, bottom plate 64 and conductor groove 66.

Figure 7A:
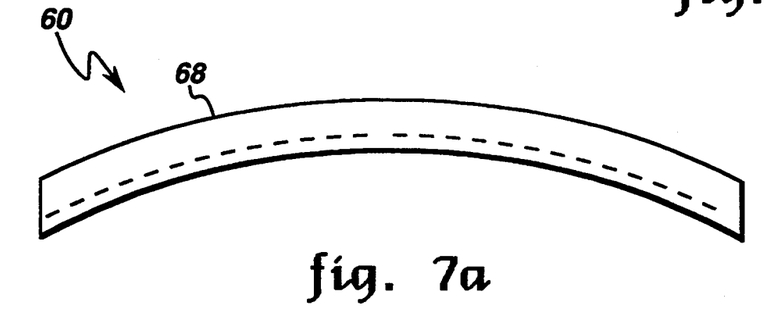
FIGS. 7a and 7b illustrate a side view and an end view, respectively, of a holder for the persistent superconducting switch for the eddy-current free, superconducting imaging magnet for imaging human limbs, according to the present invention.
Figure 7B:
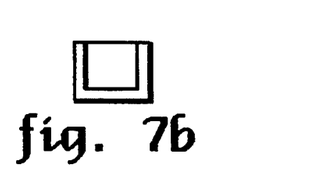
Figure 8:
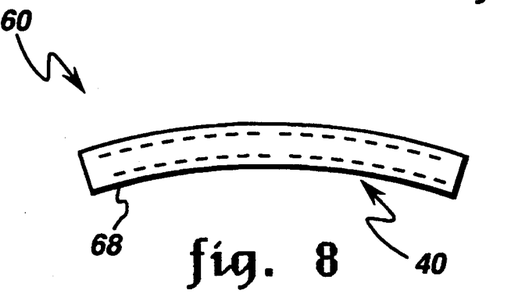
FIG. 8 illustrates the complete persistent superconducting switch for the eddy-current free, superconducting imaging magnet for imaging human limbs, according to the present invention.

After superconductor assembly 40 is placed within switch assembly 60, this assembly is then placed into holder 68 (FIG. 7a) as shown in FIG. 8. Holder 68 is a U-shaped holder as shown in FIG. 7b and is constructed, preferably, of any suitable epoxy-reinforced fiberglass.

As shown in FIG. 8, once superconducting assembly 40 is placed within assembly 60 and holder 68, persistent superconducting switch assembly 60 is formed. This persistent superconducting switch assembly 60 is then rigidly attached to cartridge 6 by conventional fasteners as shown in FIG. 4.

The uniqueness of switch assembly 60 will now be described. In order to allow a superconducting magnet to assume a persistent mode of operation, a superconducting switch must be installed in parallel to the magnet and the power supply which is used to ramp the magnet. During ramping, the superconducting switch 60 is heated up to above its transition temperature, therefore, it will be in the normal resistive state. The current from the power supply is fed into the superconducting magnet 2. If the superconducting magnet inductance is L, the final electric current to be supplied to the magnet is I, and the duration of time in which the magnet should be ramped is t, then the voltage that the power supply needs to be set it at is:

$$V = LI/t. \tag{1}$$

This voltage (V) is directly imposed across the superconducting switch assembly 60, as well. If the normal state resistance of the switch assembly 60 is R, then the heating in the switch assembly 60 from this voltage is:

$$V^2/R. \tag{2}$$

In order to prevent the superconducting switch assembly 60 from overheating, this heating rate has to be small which means that R, the normal state resistance of the switch assembly 60 is to be large.

Once magnet 2 reaches its designed electrical current, the voltage is reduced to zero (a very small value to compensate for resistive losses in the current lead assembly 100 (FIG. 1)) and the superconducting switch assembly 60 is allowed to cool down and assume superconducting state. Once in the superconducting state, the power supply (not shown) is removed and a magnet 2 is in persistent mode. In order to achieve a timely cooldown of the switch assembly 60, its thermal mass has to be sufficiently small. Thus, in this invention, the length of the end portions 49 and 50 (FIGS. 5a-5f) which has stainless steel lamination 46, 54, will act as part of the superconducting switch assembly 60 (FIG. 8). This length of the end portions 49 and 50, which is about 6 to 8 inches, has a large enough resistance to allow the ramping of the magnet 2 to occur in about 20 minutes.

A protection scheme is devised to ensure the survival of the superconducting switch 60. Two scenarios can cause the magnet 2 to dump its entire energy, which is approximately 4 KJ, into the superconducting switch 60. First, if during the ramping of the magnet 2, one or both current leads fail and burn (open), all the magnet energy will be dumped into the switch assembly 60. Second, if during the persistent mode of operation, due to any cause, the superconducting switch 60 quenches, i.e. becomes resistive, all of the magnet 2 energy will be dumped into the switch assembly 60.

In order to protect the superconducting switch 40 from burning, a resistive shunt made out of brass (not shown) is electrically attached in parallel to the magnet 2 and to the superconducting switch 60. This brass shunt has a length of approximately 70 inches, width of about 1.3 inch and a thickness of 10 mils. This brass shunt is thermally attached to the magnet 2 station. Due to its resistance ratio, this brass shunt absorbs more than 90% of the magnet energy, thereby protecting the superconducting switch 60 from burning.

Once given the above disclosure, many other features, modification or improvements will become apparent to the skilled artisan. Such features, modifications or improvements are, therefore, considered to be a part of this invention, the scope of which is to be determined by the following claims.

What is claimed is:

1. A superconductive magnet subassembly comprising:
   a) a single unbroken length of superconductive conductor coolable to below its critical temperature and having a mid portion and two end portions, wherein said mid portion is disposed between said two end portions and wherein said mid portion is wound so as to define at least one superconductive magnetic coil;
   b) a superconductive joint superconductively joining together said two end portions; and
   c) means for controllably heating said two end portions, wherein said two end portions and said controllably heating means at least partially define a superconductive switch.

2. The superconductive magnet subassembly of claim 1, wherein said two end portions are generally aligned with each other.

3. The superconductive magnet subassembly of claim 2, wherein said superconductive joint comprises a superconductive weld joint.

4. The superconductive magnet subassembly of claim 3, wherein said superconductive conductor comprises a NbSn superconductive tape.

5. The superconductive magnet subassembly of claim 1, also including an electrical insulator disposed between said two end portions apart from said superconductive joint.

6. The superconductive magnet subassembly of claim 5, also including a first metallic foil disposed between, and in contact with, said electrical insulator and one of said two end portions, and further including a second metallic foil disposed between, and in contact with, said electrical insulator and the other of said two end portions.

7. The superconductive magnet subassembly of claim 6, also including a third metallic foil surrounding said superconductive joint.

8. The superconductive magnet subassembly of claim 7, wherein said two end portions are generally aligned with each other.

9. The superconductive magnet subassembly of claim 8, wherein said superconductive joint comprises a superconductive weld joint.

10. The superconductive magnet subassembly of claim 9, wherein said superconductive conductor comprises a NbSn superconductive tape and wherein said first, second, and third metallic foils comprise stainless steel foils.

* * * * *